(12) United States Patent
Tsushima et al.

(10) Patent No.: US 12,738,451 B2
(45) Date of Patent: Sep. 15, 2026

(54) CHARGED PARTICLE BEAM APPARATUS

(71) Applicant: Hitachi High-Tech Corporation, Tokyo (JP)

(72) Inventors: Hideki Tsushima, Tokyo (JP); Naoya Ishigaki, Tokyo (JP)

(73) Assignee: Hitachi High-Tech Corporation, Tokyo (JP)

( * ) Notice: Subject to any disclaimer, the term of this patent is extended or adjusted under 35 U.S.C. 154(b) by 471 days.

(21) Appl. No.: 18/018,173

(22) PCT Filed: Aug. 24, 2020

(86) PCT No.: PCT/JP2020/031784
§ 371 (c)(1),
(2) Date: Jan. 26, 2023

(87) PCT Pub. No.: WO2022/044066
PCT Pub. Date: Mar. 3, 2022

(65) Prior Publication Data
US 2023/0268158 A1 Aug. 24, 2023

(51) Int. Cl.
*H01J 37/248* (2006.01)
*H01J 37/04* (2006.01)
(Continued)

(52) U.S. Cl.
CPC .......... *H01J 37/248* (2013.01); *H01J 37/045* (2013.01); *H01J 37/1474* (2013.01);
(Continued)

(58) Field of Classification Search
CPC ............. H01J 2237/2485; H01J 37/045; H01J 37/1474; H01J 37/244; H01J 37/248; H01J 37/265; H01J 37/28
See application file for complete search history.

(56) References Cited

U.S. PATENT DOCUMENTS 4,788,431 A * 11/1988 Eckes ..................... H01J 37/20 250/397
4,851,674 A * 7/1989 Kobayashi ........... H01J 37/265 250/311
(Continued)

FOREIGN PATENT DOCUMENTS

JP 54-158854 A 12/1979
JP 61-161643 A 7/1986
(Continued)

OTHER PUBLICATIONS

International Search Report (PCT/ISA/210) issued in PCT Application No. PCT/JP2020/031784 dated Nov. 2, 2020 with English translation (six (6) pages).
(Continued)

*Primary Examiner* — Wyatt A Stoffa
(74) *Attorney, Agent, or Firm* — Crowell & Moring LLP

(57) ABSTRACT

A charged particle beam device according to the present invention comprises a charged particle source that emits charged particles, a detection circuit that detects electrons which are generated by a sample as a result of irradiation with the charged particles, and a power storage device (107_VHD) that holds direct voltage, and comprises a charge circuit (107_CHG) that charges the power storage device with supplied voltage, and a control circuit (107_CTL) that controls the charge circuit such that charging is carried out in a period in which no sample is measured, wherein the direct voltage held by the power storage device (107_VHD) is used as operating voltage.

11 Claims, 5 Drawing Sheets

(51) Int. Cl.

*H01J 37/147* (2006.01)
*H01J 37/244* (2006.01)
*H01J 37/26* (2006.01)
*H01J 37/28* (2006.01)

(52) U.S. Cl.

CPC .......... *H01J 37/244* (2013.01); *H01J 37/265* (2013.01); *H01J 37/28* (2013.01)

(56) References Cited

U.S. PATENT DOCUMENTS 5,332,957 A * 7/1994 Lee .......................... H02J 7/443 320/112
5,998,790 A * 12/1999 Downing .............. H01J 37/224 250/397
10,847,343 B1 * 11/2020 Own ........................ H01J 37/28
11,348,758 B2 * 5/2022 Suga ...................... H01J 37/248
11,538,659 B2 * 12/2022 Nakamura .............. H01J 37/20
2004/0238739 A1 * 12/2004 Gross ....................... H01J 37/28 250/310
2005/0178966 A1 * 8/2005 Gross ....................... H01J 37/28 250/311
2010/0314540 A1 * 12/2010 Adler ....................... H01J 37/06 250/311
2012/0025093 A1 * 2/2012 Biberger ............... H01J 37/045 250/396 R
2013/0162200 A1 * 6/2013 Terry ........................ H04B 5/24 320/108
2016/0189918 A1 * 6/2016 Lai ......................... H01J 37/228 250/311
2024/0234079 A9 * 7/2024 Cui ..................... H01J 37/3171

FOREIGN PATENT DOCUMENTS

JP 8-107607 A 4/1996
JP 10-134747 A 5/1998
JP 2003-16987 A 1/2003
JP 2014-49430 A 3/2014
KR 101026161 B1 * 4/2011 .............. H01J 37/08

OTHER PUBLICATIONS

Japanese-language Written Opinion (PCT/ISA/237) issued in PCT Application No. PCT/JP2020/031784 dated Nov. 2, 2020 (five (5) pages).

* cited by examiner

[FIG. 1]
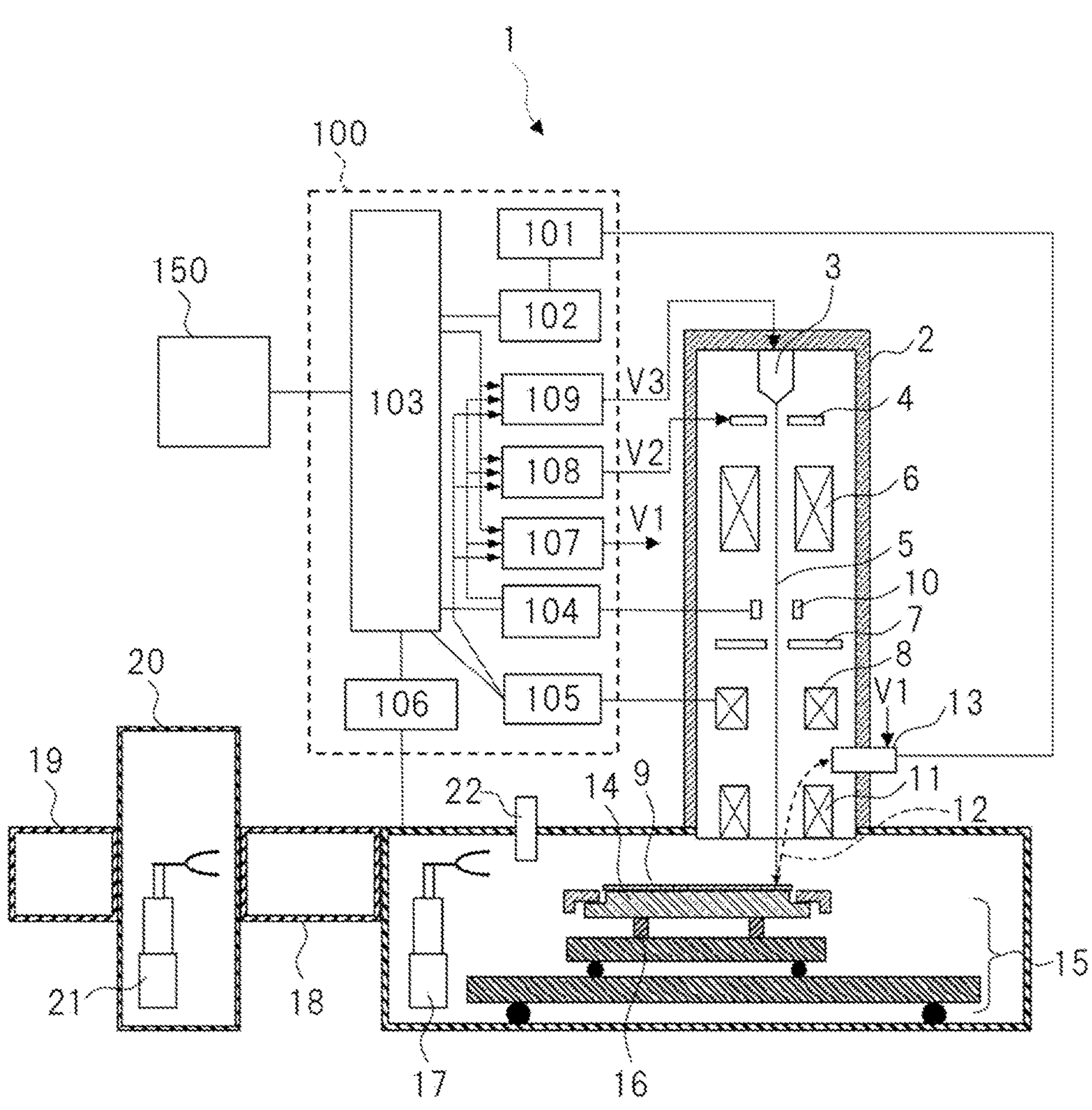

[FIG. 2]
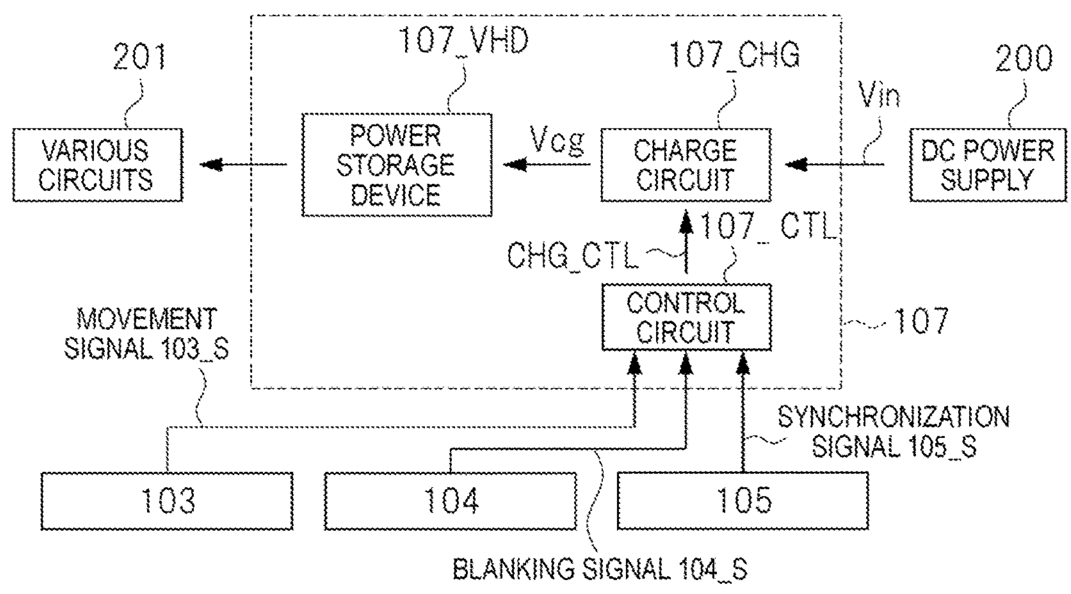
[FIG. 3]
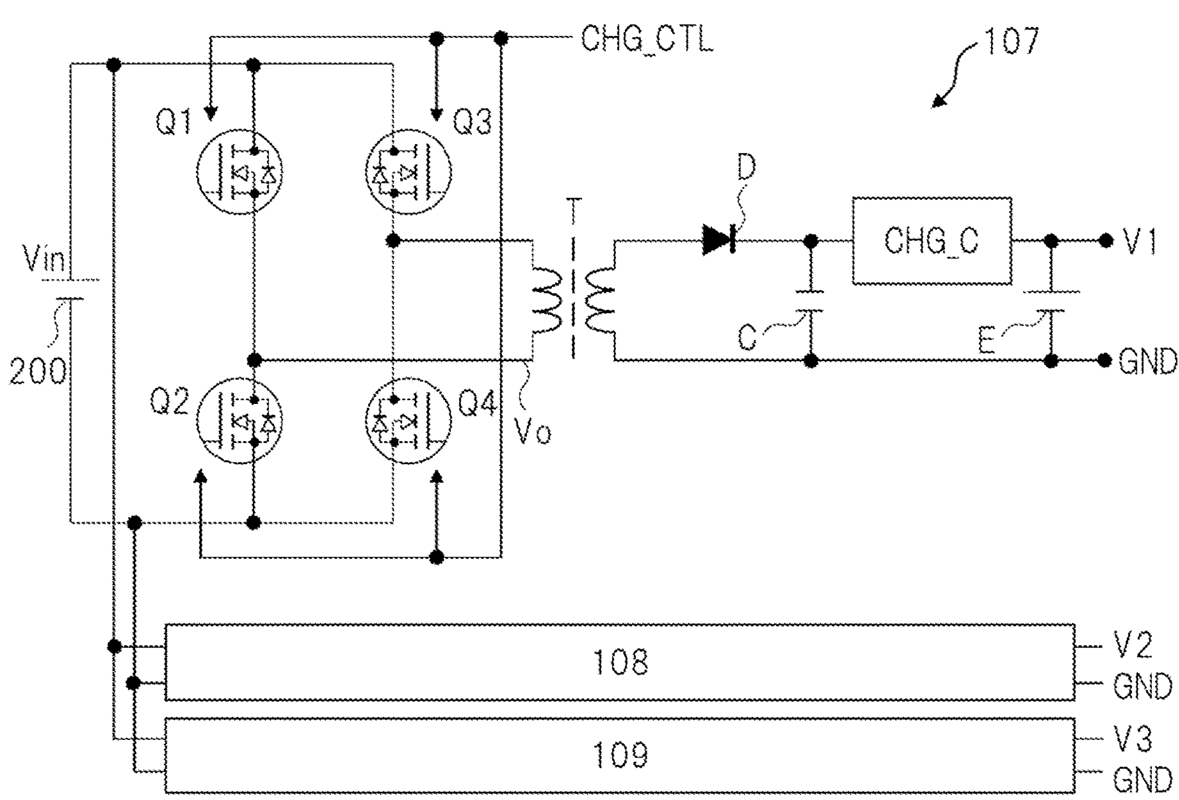

[FIG. 4]
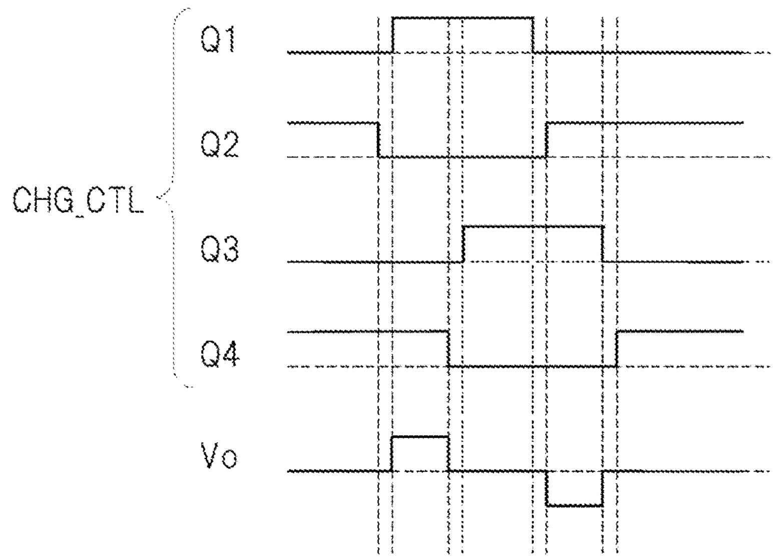
[FIG. 5]
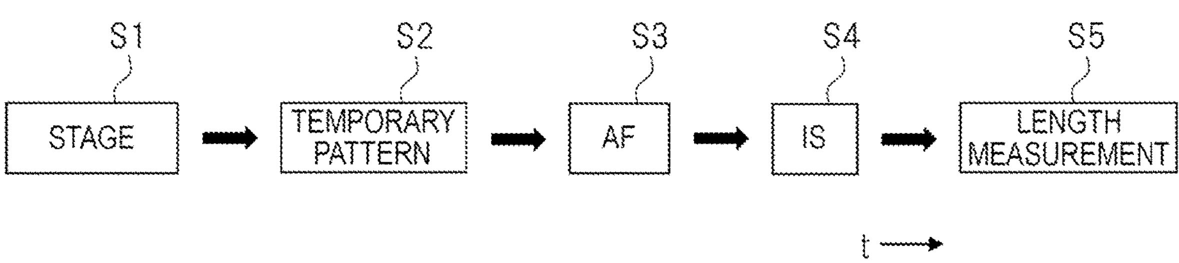

[FIG. 6]
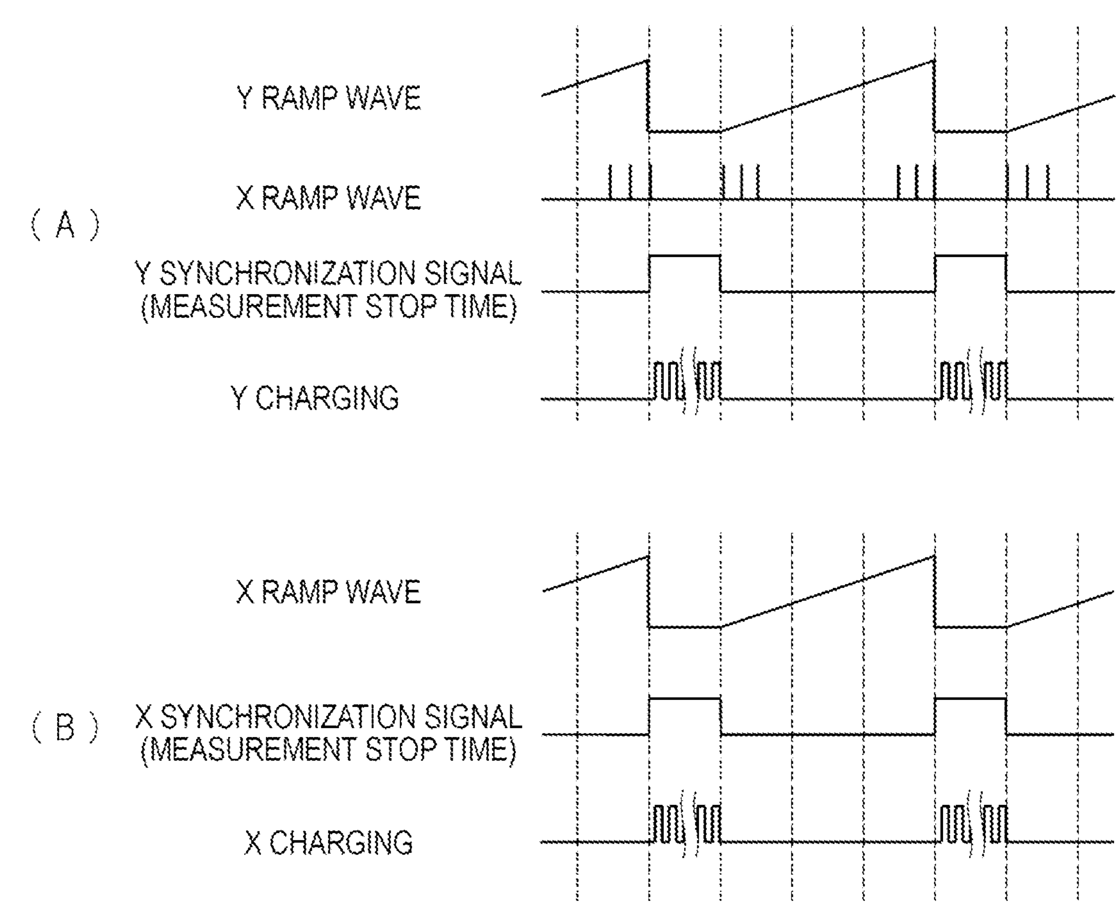

CHARGED PARTICLE BEAM APPARATUS

TECHNICAL FIELD

The present invention relates to a charged particle beam apparatus, and more particularly to a charged particle beam apparatus including a scanning electron microscope using an electron beam and a computer system coupled thereto.

BACKGROUND ART

In order to realize miniaturization and reduce an amount of heat generation, a charged particle beam apparatus is increasingly operated with an AC-DC (AC voltage-DC voltage conversion) power supply.

For example, JP2003-16987A (PTL 1) discloses an electron microscope in which a battery is provided in an electron gun body configured to generate an electron beam.

CITATION LIST

Patent Literature

PTL 1: JP2003-16987A

SUMMARY OF INVENTION

Technical Problem

An AC-DC power supply is formed of, for example, a switching power supply configured to convert a commercial AC voltage into a DC voltage. When various circuits provided in a charged particle beam apparatus are connected to the switching power supply via power supply wiring and operated at a DC voltage generated by the switching power supply, there is concern in that switching noise may be transmitted to various circuits. That is, there is a concern in that noise generated by operation of the switching power supply is transmitted to various circuits via power supply wiring and a signal line. In this case, since the noise transmitted to the various circuits is mainly common mode noise, it may be difficult to remove the noise. Further, when a circuit to be fed with power from the switching power supply is a high impedance circuit, bead noise that emphasizes noise may occur at a portion of a frequency close to a frequency of the switching noise.

In order to avoid such noise, it is conceivable to use a dropper power supply using a transformer instead of the switching power supply. However, in the dropper power supply, there is a concern in that power conversion efficiency is low and a formed DC voltage fluctuates due to temperature drift caused by heat generation.

Furthermore, as disclosed in PTL 1, it is also conceivable to use a battery. However, in this case, it takes time and effort to replace the battery, and a place at which the battery is installed is limited.

For example, in the charged particle beam apparatus, measured data includes not only the noise as described above, but also electrical noise caused by physical shaking of a scanning electron microscope by, for example, vibration or the like. In order to isolate these noises, since it is required to identify a noise generation source and a noise transmission route by relying on a noise frequency component and a generation timing of the noise, processing increases.

An object of the present invention is to provide a charged particle beam apparatus capable of avoiding noise caused by a power supply while reducing time and effort.

The above and other objects and novel features of the present invention will become apparent from the description and accompanying drawings of this specification.

Solution to Problem

The outline of a representative one of the inventions to be disclosed in the present application is briefly described as below.

A charged particle beam apparatus includes a charged particle source configured to emit a charged particle, a detection circuit configured to detect an electron generated by a sample when the sample is irradiated with the charged particle, a charge circuit including a power storage device configured to store a DC voltage, in which the charge circuit charges the power storage device with a supplied voltage, and a control circuit configured to control the charge circuit so that the charging is performed in a period during which the sample is not measured, in which the DC voltage stored in the power storage device is used as an operating voltage.

Advantageous Effects of Invention

Effects obtained by a representative one of the inventions to be disclosed in the present application are briefly described as below.

That is, according to the representative embodiment of the present invention, it is possible to provide a charged particle beam apparatus capable of avoiding noise caused by a power supply while reducing time and effort.

BRIEF DESCRIPTION OF DRAWINGS

FIG. 1 is a block diagram showing a configuration of a charged particle beam apparatus 1 according to an embodiment 1.

FIG. 2 is a block diagram showing a configuration of a power supply circuit according to the embodiment 1.

FIG. 3 is a circuit diagram showing a configuration of a specific example of the power supply circuit according to the embodiment 1.

FIG. 4 is a waveform diagram illustrating the operation of the power supply circuit according to the embodiment 1.

FIG. 5 is a diagram illustrating the operation of the charged particle beam apparatus according to the embodiment 1.

FIG. 6(A) and FIG. 6(B) are diagrams illustrating the operation of a deflection control circuit and the power supply circuit according to the embodiment 1.

FIG. 7 is a diagram showing conveyance of a semiconductor wafer according to the embodiment 1.

FIG. 8(A) and FIG. 8(B) are circuit diagrams showing a configuration of a power supply circuit according to an embodiment 2.

DESCRIPTION OF EMBODIMENTS

Embodiments will be described below with reference to the drawings. In the following drawings, functionally identical elements may be denoted by the same or corresponding numbers. Further, in the drawings used in the following embodiments, a plan view may be hatched to make the drawing easier to see. Although the attached drawings show embodiments in accordance with the principles of the present disclosure, the same are provided for the purpose of understanding the present disclosure and are not intended to be used to interpret the present disclosure in a limited manner. The description herein is merely a typical example and is not intended to limit the scope or application of the claims in any sense.

Although the following embodiments are described in sufficient detail to enable those skilled in the art to practice the present disclosure, it should be understood that other implementations or forms are possible, and that a change in configuration or structure and replacement of various elements are possible without departing from the scope and spirit of the technical ideas of the present disclosure. Therefore, the present disclosure should not be construed as being limited to the following descriptions.

Further, hereinafter, as a charged particle beam apparatus, an apparatus including a scanning electron microscope (SEM) and a computer system configured to control the SEM will be described as an example. A semiconductor wafer used for a semiconductor device will be described as an example of a sample to be measured by the SEM. Of course, the semiconductor wafer is an example, and the sample is not limited thereto. Here, although a charged particle beam apparatus using an electron beam will be described, the present disclosure can also be applied to a charged particle beam apparatus using an ion beam or the like, a general observation device, and the like.

Embodiment 1

Overall Configuration of Charged Particle Beam Apparatus

FIG. 1 is a block diagram showing a configuration of a charged particle beam apparatus 1 according to an embodiment 1. The charged particle beam apparatus 1 is used to measure the dimensions of a gate and a contact hole of a semiconductor device formed on a semiconductor wafer.

The charged particle beam apparatus 1 according to the embodiment 1 includes a critical-dimension SEM part provided with an electron gun or the like configured to emit an electron, a computer system 100 connected to the SEM part and an input-and-output device 150 connected to the computer system 100. In the embodiment 1, a description will be given as to a case in which an electron is used as an example of a charged particle, but the embodiment 1 can also be applied to an apparatus including a charged particle source configured to emit other charged particles as an electron gun.

In the SEM part, electrons are emitted as charged particles from an electron gun (charged particle source) 3 stored in a housing 2 maintained in a high vacuum. The emitted electrons are accelerated by a primary electron acceleration electrode 4 having a high voltage applied thereto. The accelerated electrons are converged as an electron beam (charged particle beam) 5 by an electron lens for convergence 6. After that, an amount of beam current of the electron beam 5 is adjusted by an aperture 7. After that, the electron beam 5 is deflected by a scanning coil 8 and two-dimensionally scans a semiconductor wafer 9 serving as a sample. Further, by deflecting the electron beam 5 with a blanking deflector (blanking electrode) 10, it is possible to perform a control operation to cause the semiconductor wafer 9 not to be irradiated with the electron beam 5.

An electronic objective lens 11 is disposed directly above the semiconductor wafer 9. The electron beam 5 is narrowed and focused by the electronic objective lens 11 and is incident on the semiconductor wafer 9. As a result of a primary electron (electron beam 5) incident thereon, a secondary electron 12 generated from the semiconductor wafer 9 is detected by a secondary electron detector (secondary electron detection circuit) 13. A detection signal (analog signal) detected by the secondary electron detector 13 is supplied to the computer system 100.

A signal detection unit (secondary electron signal detection circuit) 101 in the computer system 100 converts the detection signal into a digital signal by, for example, an analog/digital (A/D) conversion circuit. Based on the digital signal, an image processing unit (secondary electron signal processing circuit) 102 in the computer system 100 executes image processing of generating a two-dimensional image and outputs the same to the input-and-output device 150. Since the amount of the secondary electrons detected, that is, measured by the secondary electron detector 13 reflects a shape of a sample surface, the shape of the surface can be imaged based on information on the detected secondary electrons.

The input-and-output device 150 includes an input device configured to enable a user to input an instruction or the like, and a display device configured to display a GUI screen provided to enable the user to input the instruction or the like and an SEM image (two-dimensional image generated by the image processing unit 102, or the like). The input device is a device configured to enable a user to input data or an instruction, such as a mouse, a keyboard, and a voice input device. The display device is, for example, a display apparatus. Such an input-and-output device (user interface) may be a touch panel capable of inputting and displaying data.

The semiconductor wafer 9 is held on an electrostatic chuck 14 while ensuring a certain degree of flatness, and is fixed on an X-Y stage 15. Here, FIG. 1 illustrates a cross-sectional view of the housing 2 and an internal structure thereof when viewed from a lateral direction. The semiconductor wafer 9 is freely movable in both an X direction and a Y direction, and as such, any position in the semiconductor wafer surface can be measured. Further, the X-Y stage 15 also includes a wafer conveyance lift mechanism 16. The wafer conveyance lift mechanism 16 has an elastic body incorporated thereinto, in which the elastic body can be vertically moved. By using this elastic body, the semiconductor wafer 9 can be attached to and detached from the electrostatic chuck 14. The semiconductor wafer 9 can be transferred to and from a load chamber 18 (preliminary exhaust chamber) by cooperative operation of the wafer conveyance lift mechanism 16 and a conveyance robot 17.

Hereinafter, a description will be given as to the operation of conveying the semiconductor wafer 9 to be measured up to the electrostatic chuck 14. First, the semiconductor wafer 9 set in a wafer cassette 19 is conveyed into the load chamber 18 by a conveyance robot 21 in a mini-en 20 (mini-environment). The inside of the load chamber 18 can be evacuated and released to the atmosphere by an evacuation system (not shown). By opening and closing a valve (not shown) and operating the conveyance robot 17, the semiconductor wafer 9 is conveyed onto the electrostatic chuck 14 while maintaining a degree of vacuum in the housing 2 at a practically acceptable level.

A surface voltage meter 22 is attached to the housing 2. A position of the surface voltage meter 22 in a height direction is adjusted so that a distance from a probe tip of the surface voltage meter to the electrostatic chuck 14 or the semiconductor wafer 9 becomes appropriate, and then is fixed, thereby making it possible to measure a surface voltage of the electrostatic chuck 14 or the semiconductor wafer 9 in a contactless manner.

In FIG. 1, a reference numeral 103 in the computer system 1 denotes an overall control circuit configured to control a control unit or a control circuit (not shown) configured to control each of other configuration elements forming the charged particle beam apparatus 1 in addition to a blanking control circuit 104, a deflection control circuit 105, a mechanism system control circuit 106, and DC power supply circuits (power supply circuits) 107 to 109.

The blanking control circuit 104 is connected to the blanking deflector 10 and controls the blanking deflector 10 according to control by the overall control circuit 103. For example, as described above, the blanking control circuit 104 controls the blanking deflector 10 so that the semiconductor wafer 9 is not irradiated with the electron beam 5.

The deflection control circuit 105 is connected to the scanning coil 8 and controls the scanning coil 8 according to control by the overall control circuit 103. For example, the deflection control circuit 105 controls the scanning coil 8 so that the electron beam 5 being emitted onto the semiconductor wafer 9 moves two-dimensionally in a measurement period during which the semiconductor wafer 9 is measured.

The mechanism system control circuit 106 controls mechanism systems such as the electrostatic chuck 14, the X-Y stage 15, the wafer conveyance lift mechanism 16, the conveyance robots 17 and 21, and the surface voltage meter 22 according to the control of the overall control circuit 103.

The above-described components provided in the computer system 100 can be implemented using a general-purpose computer. In this case, each of the components is implemented, for example, as a function of a program to be executed on a computer. In this case, the general-purpose computer includes at least a processor such as a central processing unit (CPU), a storage unit such as a memory, and a storage device such as a hard disk. Although not particularly limited herein, the two-dimensional image generated by the image processing unit 102 is stored in the hard disk described above.

Furthermore, for example, the general-purpose computer may be configured as a multiprocessor system. In this case, the control of each component of an electron optical system in the housing 2 may be implemented by a main processor. Additionally, the control of the X-Y stage 15, the conveyance robots 17 and 21, and the surface voltage meter 22 may be implemented by a sub-processor. Further, the image processing unit 102 configured to perform image processing of generating an SEM image based on a signal detected by the secondary electron detector 13 may be implemented by a sub-processor.

The DC power supply circuits 107 to 109 are connected to the overall control circuit 103, the blanking control circuit 104, and the deflection control circuit 105. The DC power supply circuits 107 to 109 include a rechargeable power storage device, and respectively output DC voltages V1 to V3 based on voltage charged (stored) in the power storage device.

In FIG. 1, the DC voltage V1 output from the DC power supply circuit 107 is supplied to the secondary electron detector 13. The secondary electron detector 13 is operated with this DC voltage V1 as an operating voltage thereof during the measurement period. The DC voltage V2 output from the DC power supply circuit 108 is supplied to the primary electron acceleration electrode 4, and the primary electron acceleration electrode 4 is operated with this DC voltage V2 as an operating voltage thereof during the measurement period. Further, the DC voltage V3 output from the DC power supply circuit 109 is supplied to the electron gun 3, and the electron gun 3 is operated with this DC voltage V3 as an operating voltage thereof during the measurement period.

In FIG. 1, the computer system 100 includes the DC power supply circuits 107 to 109, but the present disclosure is not limited thereto. For example, the DC power supply circuits 107 to 109 may not be provided in the computer system 100, but may be provided on the SEM part side. In addition, although three DC power supply circuits 107 to 109 are provided in FIG. 1, the number thereof is not limited to three. For example, one or four or more DC power supply circuits may be provided.

Although FIG. 1 shows that the DC voltage V1 is supplied to the secondary electron detector 13, for example, the DC voltage V1 may also be supplied to the secondary electron signal detection circuit 101.

DC Power Supply Circuit

Next, the DC power supply circuits (power supply circuits) 107 to 109 will be described with reference to the drawings. Since the DC power supply circuits 107 to 109 have similar configurations to each other, the DC power supply circuit 107 will be described herein as a representative thereof. FIG. 2 is a block diagram showing the configuration of the power supply circuit according to the embodiment 1.

The power supply circuit 107 includes a charge circuit 107_CHG, a power storage device 107_VHD, and a control circuit 107_CTL. The charge circuit 107_CHG is supplied with a DC voltage Vin from a direct current power supply (DC power supply) 200, converts the DC voltage Vin into a predetermined voltage Vcg, and supplies the voltage Vcg to the power storage device 107_VHD. The power storage device 107_VHD includes, for example, a battery and/or a capacitor, and is charged with the voltage Vcg. The voltage (storage voltage) charged and stored in the power storage device 107_VHD is supplied to various circuits 201 provided in the charged particle beam apparatus 1. In the configuration shown in FIG. 1, the storage voltage stored in the power storage device 107_VHD is supplied as the voltage V1 to the secondary electron detector 13, and the secondary electron detector 13 is operated using the voltage V1 as a power supply voltage.

A movement signal 103_S is supplied from the overall control circuit 103 to the control circuit 107_CTL, a blanking signal 104_S is supplied from the blanking control circuit 104, and a synchronization signal 105_S is supplied from the deflection control circuit 105. The overall control circuit 103 outputs the movement signal 103_S for example, in a conveyance period during which the semiconductor wafer 9 (FIG. 1) is conveyed from the wafer cassette 19 (FIG. 1) to the position where the semiconductor wafer 9 is irradiated with the electron beam 5 (FIG. 1). The blanking control circuit 104 outputs the blanking signal 104_S in a blanking period during which blanking is performed, that is, in a period during which the semiconductor wafer 9 is not irradiated with the electron beam 5. Further, the deflection control circuit 105 outputs the synchronization signal 105_S. The synchronization signal 105_S represents a return period when the semiconductor wafer 9 is two-dimensionally scanned with the electron beam 5.

The control circuit 107_CTL controls the charge circuit 107_CHG with a control signal CHG_CTL so that the charge circuit 107_CHG charges the power storage device 107_VHD in a period during which any one of the movement signal 103_S, the blanking signal 104_S, and the synchronization signal 105_S is supplied thereto. Accordingly, the power storage device 107_VHD according to the embodiment 1 is charged in the conveyance period, the blanking period, and the return period, which are non-measurement periods during which the semiconductor wafer 9 is not measured. Further, in the measurement period during which the semiconductor wafer 9 is measured, the various circuits 201 (secondary electron detector 13) are operated with the voltage V1 based on the DC voltage stored in the power storage device 107_VHD. As a result, it is possible to suppress generation of noise caused by the power supply when various circuits are operated. In addition, it becomes easy to distinguish between the noise caused by the power supply and noise caused by physical vibration or the like. Further, since the power storage device is a source of power supply to the various circuits 201, it is possible to reduce time and effort related to battery replacement.

Specific Example of Power Supply Circuit

FIG. 3 is a circuit diagram showing a specific configuration example of the power supply circuit according to the embodiment 1. Further, FIG. 4 is a waveform diagram illustrating the operation of the power supply circuit according to the embodiment 1.

The power supply circuit 107 includes four N-channel field effect transistors (MOSFETs) Q1 to Q4, a transformer T, a diode D, a capacitor C, a charge control circuit CHG_C, and a battery (power storage device) E.

The MOSFETs Q1 and Q2 are connected in series so that the source and drain paths thereof are in series, thereby forming a series connection circuit. Similarly, the MOSFETs Q3 and Q4 are also connected in series so that the source and drain paths thereof are in series, thereby forming a series connection circuit. These two series connection circuits are connected in parallel with the DC power supply 200. A primary (first) coil of the transformer T is connected between a connection node between the MOSFETs Q1 and Q2 and a connection node between the MOSFETs Q3 and Q4. The control signal CHG_CTL from the control circuit 107_CTL shown in FIG. 2 is supplied to gates of these MOSFETs Q1 to Q4.

In the transformer T, a rectifier circuit including the diode D and the capacitor C is connected to a secondary (second) coil insulated from a primary coil. A DC voltage rectified by the rectifier circuit is supplied to the battery E via the charge control circuit CHG_C. Further, the voltage charged in the battery E is output as the output voltage V1 of the power supply circuit 107. Here, the charge control circuit CHG_C is a circuit configured to perform a control operation to supply an appropriate voltage to the battery E when the battery E is charged.

During the non-measurement period described above, the MOSFETs Q1 to Q4 are controlled by the control signal CHG_CTL so that the same are turned on or off, as shown in FIG. 4. In a waveform shown in FIG. 4, the MOSFET is turned on at a high level, and the MOSFET is turned off at a low level. During the non-measurement period, the MOSFETs Q1 to Q4 form a switching circuit. Therefore, during the non-measurement period, the voltage Vin of the DC power supply 200 is converted into an appropriate voltage by the switching circuit, the transformer T, and the charge control circuit CHG_C, and the battery E is charged. In the embodiment 1, at least one of the MOSFETs Q1 to Q4 is controlled, by the control signal CHG_CTL, to be turned on during the non-measurement. In this manner, a soft switch is implemented.

During the measurement period, the MOSFETs Q1 to Q4 are controlled, by the control signal CHG_CTL, to be in the off state. As a result, the switching circuit is stopped, and as such, the battery E is not charged.

Although the DC power supply 200 is shared by the power supply circuits 107 to 109 in FIG. 3, the present disclosure is not limited thereto. That is, a separate DC power supply 200 may be provided for each of the power supply circuits 107 to 109. Further, for example, up to the primary side coil of the transformer T, the DC power supply 200 may be shared by the power supply circuits 107 to 109.

The voltage Vin of the DC power supply 200 may be formed by, for example, an AC-DC power supply configured to convert a commercial power supply to a DC power supply.

Operation of Charged Particle Beam Apparatus

FIG. 5 is a diagram illustrating the operation of the charged particle beam apparatus according to the embodiment 1. The measurement operation in the charged particle beam apparatus 1 will be described with reference to FIGS. 1 and 5.

FIG. 5 shows a measurement process from conveying the semiconductor wafer 9 to be measured to the X-Y stage to measuring a length thereof. In order to measure the length, processes (steps) from steps S1 to S5 are executed with the elapse of time t.

In step S1, the semiconductor wafer 9 is conveyed, for example, from the wafer cassette 19 to the X-Y stage 15, and the semiconductor wafer 9 is loaded onto the stage.

Next, in step S2, the position of the semiconductor wafer 9 is recognized using a temporary pattern formed in advance on the semiconductor wafer 9, and in step S3, the focus of the electron beam 5 is adjusted by autofocus (AF). Thereafter, in step S4, image shift (IS) is performed to adjust an optic axis of the electron beam. In step S5 after step S4, length measurement is performed.

In this length measurement, the scanning coil 8 deflects the electron beam 5 so that a position to which the electron beam 5 is emitted is changed two-dimensionally in a predetermined region of the semiconductor wafer 9.

Deflection of Electron Beam and Charging

During the length measurement (measurement) period in step S5, the deflection control circuit 105 controls the scanning coil 8 according to the control of the overall control circuit 103, whereby the position to which the electron beam 5 is emitted is changed two-dimensionally. The operation of the deflection control circuit 105 at this time will be described with reference to the drawing. FIG. 6 is a diagram illustrating the operation of the deflection control circuit and the power supply circuit according to the embodiment 1. In order to two-dimensionally change the position to which the electron beam 5 is emitted, a two-dimensional plane is represented by an X axis and a Y axis, and the deflection control circuit 105 outputs an X synchronization signal corresponding to the X axis and a Y synchronization signal corresponding to the Y axis as the synchronization signal 105_S (FIG. 2). FIG. 6(A) shows the Y synchronization signal, and FIG. 6(B) shows the X synchronization signal.

The deflection control circuit 105 moves the electron beam 5 being emitted to a predetermined position (Y initial coordinates, X initial coordinates) along the X axis in a period during which the X synchronization signal is at a low level. This increases, for example, a value of an X ramp wave shown in FIG. 6(B) in the period during which the X synchronization signal is at a low level. As the X ramp wave increases, the coordinates of the X axis are increased from the X initial coordinates, thereby emitting the electron beam 5 to a position of the increased coordinates.

When the X synchronization signal changes to a high level and then to a low level again, the value of the X ramp wave increases. At this time, as shown in FIG. 6(A), since a value of a Y ramp wave also increases, the deflection control circuit 105 causes the electron beam 5 to be emitted while sequentially increasing the X coordinates from the X initial coordinates at the coordinates of the Y axis increased from the Y initial coordinates. Accordingly, the electron beam 5 is emitted two-dimensionally.

A period during which the X synchronization signal is at a high level can be regarded as a return period (X return period) during which the electron beam 5 is returned along the X axis, and a period during which the Y synchronization signal is at a high level can be regarded as a return period (Y return period) during which the electron beam 5 is returned along the Y axis. The return period can be regarded as a measurement stop time (non-measurement period) during which no measurement is performed. In the power supply circuits 107 to 109 according to the embodiment 1, the power storage device (for example, 107_VHD in FIG. 2) is charged during the return period. That is, the power storage device is charged during the return period and is not charged in the period during which the synchronization signal is at a low level. In a period during which the synchronization signal is at a low level, the voltage charged in the power storage device is supplied to the secondary electron detector 13, the primary electron acceleration electrode 4, and the electron gun 3.

As shown in FIG. 6(A), the X ramp wave is generated a plurality of times in the period during which the Y ramp wave is increasing. Therefore, the Y return period is longer than the X return period. The X return period is, for example, time in μS unit, and the Y return period is, for example, time in mS unit. In the example shown in FIG. 3, the battery E is used as the power storage device, but, for example, a capacitor functioning as the power storage device may be provided in parallel with the battery E. In this case, it is desirable to charge the battery E in the Y return period (long return period) during which the measurement stop time is long, and to charge the capacitor as a power storage device in the X return period during which the measurement stop time is short.

Charging During Movement of Semiconductor Wafer

Figures 7, 8:
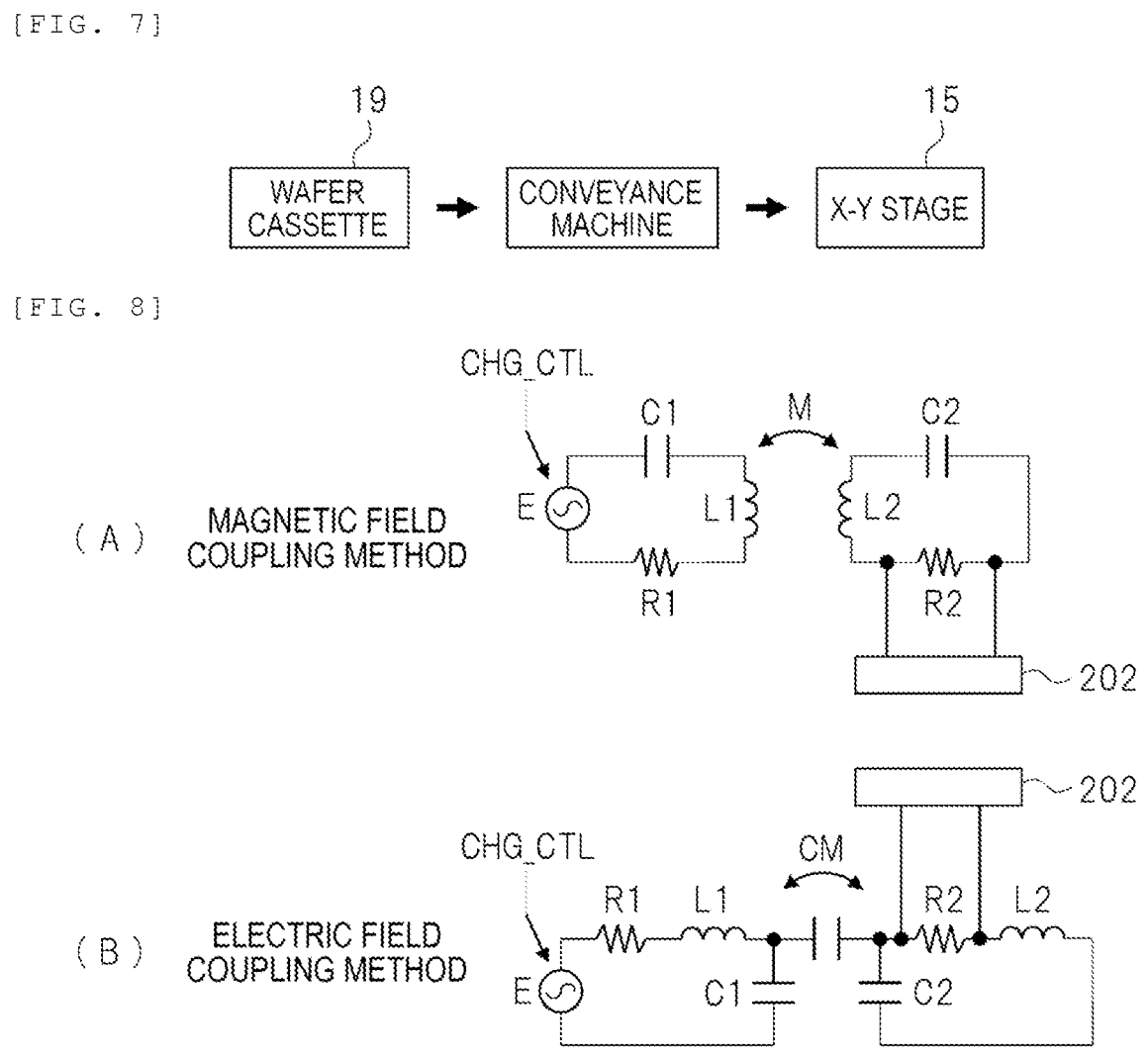

FIG. 7 is a diagram showing the conveyance of the semiconductor wafer according to the embodiment 1. During the measurement, the semiconductor wafer 9 (FIG. 1) is conveyed from the wafer cassette 19 to the X-Y stage 15 in vacuum. In this case, the semiconductor wafer 9 is conveyed to the X-Y stage 15 using the conveyance robot 21 or the like shown in FIG. 1 as a conveyance machine disposed in the atmosphere. Conveyance time is required to perform this conveyance.

After the semiconductor wafer 9 is conveyed to the X-Y stage 15, as shown in FIG. 5, steps S2 to S4 are executed to set the semiconductor wafer 9 at a measurable position (irradiation position at which the semiconductor wafer 9 is irradiated with charged particles). That is, after the semiconductor wafer 9 is conveyed to the X-Y stage 15, there is preparation time until the actual measurement is started. In consideration of a total time of the conveyance time required to convey the semiconductor wafer 9 and the preparation time, it takes several tens of seconds to several minutes.

The overall control circuit 103 according to the embodiment 1 outputs the movement signal 103_S (FIG. 2) when the semiconductor wafer 9 is being conveyed and when preparation is being made to start the actual measurement. The control circuit (for example, 107_CTL in FIG. 2) in the power supply circuit according to the embodiment 1 grasps conveyance and preparation by the movement signal 103_S, and causes the charge circuit (107_CHG) to charge the power storage device (107_VHD) during the total time of the conveyance time and the preparation time (conveyance time+preparation time). As a result, the power storage device is charged until the measurement is actually started.

By using this relatively long time (conveyance time+preparation time), it is possible to rapidly charge a large-capacitance battery that takes time to be recharged even when the same is used as a power storage device. It is also possible to perform trickle charging. Depending on the configuration of the charge control circuit CHG_C (FIG. 3) or the like, it is possible to charge several Wh to several tens of Wh per minute.

Charging During Blanking

When the blanking control circuit 104 blanks the electron beam 5 using the blanking deflector 10 according to the control of the overall control circuit 103, the blanking control circuit 104 outputs the blanking signal 104_S (FIG. 2). As a result, the power storage device is charged when blanking is performed.

In the embodiment 1, the non-measurement period during which no measurement is performed is notified to the power supply circuit by the synchronization signal, the blanking signal, and the movement signal, and the power storage device is charged during the non-measurement period. In addition, in the measurement period during which actual measurement is performed using the electron beam, charging of the power storage device is stopped and various circuits are operated by the voltage stored (charged) in the power storage device. Accordingly, it is possible to suppress generation of noise caused by the power supply during the measurement period.

In the embodiment 1, the non-measurement period is specified by the synchronization signal, the blanking signal, and the movement signal, but the present disclosure is not limited thereto. That is, by using at least one of the synchronization signal, the blanking signal, and the movement signal, the non-measurement period may be specified, and the power storage device may be charged in the specified non-measurement period. Accordingly, it is possible to simplify the configuration of the power supply circuit.

Embodiment 2

In an embodiment 2, a wireless power supply device is used as a device configured to supply power to the power storage device. In the wireless power supply device, power is supplied as an alternating current signal such as a high frequency. Therefore, a large amount of noise is generally generated. However, by performing wireless power supply and charging the power storage device during the non-measurement period, and by stopping wireless power supply during the measurement period, noise caused by the power supply can be suppressed.

In the wireless power supply, since a distance between a power transmitting coil or a power transmitting electrode and a power receiving coil or a power receiving electrode is, for example, 5 to 10 cm, a magnetic field coupling method, an electric field coupling method, a magnetic field resonance method, and the like are conceivable as methods of the wireless power supply. Here, the magnetic field coupling method and the electric field coupling method will be described as examples thereof with reference to the drawings, but the present disclosure is not limited thereto. Of course, the magnetic field resonance method may also be used. In the wireless power supply method, for example, power supply is several tens of W, voltage is several tens of V, and insulation withstand voltage is several tens of kV.

FIG. 8 is a circuit diagram showing a configuration of a power supply circuit according to the embodiment 2. Here, FIG. 8(A) shows the configuration of the power supply circuit when the magnetic field coupling method is adopted, and FIG. 8(B) shows the configuration of the power supply circuit when the electric field coupling method is adopted.

In FIG. 8(A), the wireless power supply device is formed of capacitors C1 and C2, coils L1 and L2, resistors R1 and R2, and an AC power supply E controlled by a control signal CHG_CTL. The control signal CHG_CTL is generated by the control circuit (107_CTL), as shown in FIG. 2, and is output during the non-measurement period based on the synchronization signal, the blanking signal, and the movement signal. As a result, the AC power supply E generates an AC signal during the non-measurement period. During resonance, an electromagnetic coupling M transmits the AC signal from the AC power supply E to the coil L2, and is propagated to a power supply load 202 from the resistor R2.

The power supply load 202 includes, for example, a full bridge rectifier circuit, and the charge control circuit CHG_C and the battery E shown in FIG. 3. During the non-measurement period, the AC signal propagated to the resistor R2 is rectified by a rectifier circuit as an AC voltage and supplied to the battery E via the charge control circuit CHG_C. As a result, charging of the battery E is performed during the non-measurement period, and charging of the battery E is stopped during the measurement period.

In FIG. 8(B), the wireless power supply device is formed of capacitors C1 and C2, coils L1 and L2, resistors R1 and R2, and an AC power supply E controlled by a control signal CHG_CTL. Based on the control signal CHG_CTL, the AC power supply E generates an AC signal during the non-measurement period. During resonance, the AC signal from the AC power supply E is propagated to the resistor R2 side by a capacitance coupling CM, and is propagated to a power supply load 202 from the resistor R2.

The battery in the power supply load 202 is charged during the non-measurement period, and charging of the battery is stopped during the measurement period.

As described above, in the embodiment 2 as well, charging of the battery is performed during the non-measurement period, and charging of the battery is stopped during the measurement period. Noise caused by the power supply can be suppressed by using the voltage stored in the battery as an operating voltage of various circuits during the measurement period. In addition, since the AC power supply E and various circuits are electrically separated due to the wireless power supply, in principle, it is possible to cut off induction noise, power supply noise generated according to the frequency of the commercial power supply, Y terminal noise, and the like. Further, since power is supplied wirelessly, the power receiving side can be mounted on the charged particle beam apparatus as a floating power supply.

According to the embodiment, the power storage device is charged during the non-measurement period, and various circuits are operated by the DC voltage charged in the power storage device during the measurement period. Therefore, it is possible to suppress noise caused by the power supply, that is, asynchronous noise generated when the DC voltage is formed, from being propagated to various circuits via power supply wiring. Accordingly, it is possible to suppress deterioration of a detection signal, a reference voltage, and the like in various circuits. Further, it is possible to suppress deterioration of a signal in a conversion circuit such as an A/D conversion circuit and/or a digital/analog (D/A) conversion circuit.

In addition, in a charged particle beam apparatus, in addition to electrical noise generated when a DC voltage is formed, noise is also generated by physical vibration, and noise is also generated by vacuum deterioration in a housing. According to the embodiment, since it is possible to suppress the noise caused by the power supply, it becomes easy to isolate a noise source.

Furthermore, when noise reduction is achieved through image processing, noise caused by different power supplies for each pixel is suppressed, thereby making it possible not only to reduce the number of times of interpolation and calculation processing executed in image processing, but also to improve deterioration of results of the interpolation and the calculation and reproducibility of measurement results. As a result, it is possible to reduce post-processing with respect to a detection result obtained by measurement and to speed up the measurement.

Because the power storage device is used, it is possible to reduce time and effort required to replace a battery. In addition, since charging is performed during the non-measurement period, it is possible not only to reduce time and effort required for charging, but also to prevent failure caused by forgetting to perform charging.

Unlike a dropper power supply, miniaturization and high efficiency can be achieved, thereby making it possible to improve a degree of freedom of an installation location and to reduce waste heat treatment.

Charging is performed only during the non-measurement period, thereby making it possible to eliminate an excessive low-pass filter for a detection signal. Accordingly, an SN ratio of the detection signal can be improved.

In the embodiment, a secondary electron detector, a scanning coil, and an electron gun have been described as examples of various circuits to which a DC voltage is supplied from a power storage device during measurement period, but the present disclosure is not limited thereto. For example, the various circuits may be a filament lighting circuit, an A/D conversion circuit, a D/A conversion circuit, a high voltage circuit, and the like. Additionally, although a circuit using the transformer T is described in FIG. 3, the present disclosure is not limited thereto, and a piezoelectric element may be used. Furthermore, transistors forming a switching circuit are not limited to MOSFETs, and may be IGBTs or BJTs.

Further, the battery may be configured to output a high voltage by connecting a plurality of constant voltage batteries in series.

When the power supply circuits 107 to 109 shown in FIG. 3 are regarded as one power supply circuit, this one power supply circuit includes a first power storage device, a second power storage device, and a third power storage device configured to supply power to the secondary electron detector, the scanning coil, and the electron gun during the measurement period.

The present invention is not limited to the above-described embodiments, and includes various modifications.

Furthermore, the above-described embodiments are described in detail to explain the present invention in an easy-to-understand manner, and are not necessarily limited to those having all the described configurations.

REFERENCE SIGNS LIST

1: charged particle beam apparatus
2: housing
3: electron gun
4: primary electron acceleration electrode
5: electron beam
10: blanking deflector
8: scanning coil
9: sample
13: secondary electron detector
100: computer system
103: overall control circuit
104: blanking control circuit
105: deflection control circuit
107 to 109: power supply circuit

The invention claimed is:

1. A charged particle beam apparatus comprising:

a charged particle gun configured to emit a charged particle;

a detection circuit configured to detect an electron generated in a sample when the sample is irradiated with the charged particle in a period during which the sample is measured;

a charge circuit including a power storage device configured to store a DC voltage, wherein the charge circuit charges the power storage device with a supplied voltage; and a control circuit configured to control the charge circuit so that the charging is performed in a period during which the sample is not measured, rather than in a period during which the sample is measured, wherein, the charged particle gun, in which the DC voltage stored in the power storage device is supplied as an operating voltage, generates the charged particle based on the supplied DC voltage, and wherein the control circuit specifies a non-measurement period using at least one of a blanking signal that controls the charged particle so as not to be irradiated onto the sample and a movement signal that controls stage conveyance of the sample, and controls charging of the power storage device during the specified non-measurement period.

2. The charged particle beam apparatus according to claim 1, wherein the DC voltage is supplied to the detection circuit, and the detection circuit is operated by the DC voltage.

3. The charged particle beam apparatus according to claim 1, wherein the period during which the sample is measured is a period during which the charged particle is irradiated so as to scan over the sample one-dimensionally or two-dimensionally.

4. The charged particle beam apparatus according to claim 3, further comprising an acceleration electrode configured to accelerate the charged particle, wherein a voltage based on the DC voltage is supplied to the acceleration electrode.

5. The charged particle beam apparatus according to claim 4, wherein the charge circuit includes, as the power storage device, a first power storage device configured to store the DC voltage supplied to the detection circuit, a second power storage device configured to store the DC voltage supplied to the electron gun, and a third power storage device configured to store the DC voltage corresponding to the voltage supplied to the acceleration electrode.

6. The charged particle beam apparatus according to claim 1, wherein the charge circuit includes:

a switching circuit including a plurality of transistors controlled in response to a control signal from the control circuit, a transformer including a first coil to which a voltage from the switching circuit is supplied and a second coil insulated from the first coil, and a rectifier circuit configured to rectify a voltage in the second coil, and wherein the power storage device includes a capacitor and a battery charged by the voltage generated by the rectifier circuit.

7. The charged particle beam apparatus according to claim 1, wherein a voltage is supplied to the power storage device in a contactless manner.

8. The charged particle beam apparatus according to claim 1, wherein the sample is a semiconductor wafer.

9. A charged particle beam apparatus, comprising:

a charged particle gun configured to emit a charged particle;

a detection circuit configured to detect an electron generated in a sample when the sample is irradiated with the charged particle in a period during which the sample is measured;

a charge circuit including a power storage device configured to store a DC voltage, wherein the charge circuit charges the power storage device with a supplied voltage;

a control circuit configured to control the charge circuit so that the charging is performed in a period during which the sample is not measured; and a deflection control circuit configured to deflect the charged particle based on a synchronization signal so as to two-dimensionally scan the sample, wherein the DC voltage stored in the power storage device is supplied as an operating voltage, and wherein the synchronization signal is supplied to the control circuit, and the control circuit instructs the charge circuit to charge the power storage device in a non-measurement period indicated by the synchronization signal, the charged particle beam apparatus further comprising a blanking control circuit configured to perform a control operation according to a blanking signal so that the sample is not irradiated with the charged particle, wherein the blanking signal is supplied to the control circuit, and the control circuit instructs the charge circuit to charge the power storage device in a period controlled by the blanking signal so that the sample is not irradiated with the charged particle.

10. A charged particle beam apparatus, comprising:

a charged particle gun configured to emit a charged particle;

a detection circuit configured to detect an electron generated in a sample when the sample is irradiated with the charged particle in a period during which the sample is measured;

a charge circuit including a power storage device configured to store a DC voltage, wherein the charge circuit charges the power storage device with a supplied voltage;

a control circuit configured to control the charge circuit so that the charging is performed in a period during which the sample is not measured; and a stage configured to convey the sample from a predetermined position to an irradiation position where the sample is irradiated with the charged particle, wherein the DC voltage stored in the power storage device is supplied as an operating voltage, and wherein a movement signal of controlling conveyance of the stage is supplied to the control circuit, and the control circuit instructs the charge circuit to charge the power storage device in a period during which the stage moves, in response to the movement signal, the sample from the predetermined position to the irradiation position.

11. A charged particle beam apparatus, comprising:

a charged particle gun configured to emit a charged particle;

a detection circuit configured to detect an electron generated in a sample when the sample is irradiated with the charged particle in a period during which the sample is measured;

a charge circuit including a power storage device configured to store a DC voltage, wherein the charge circuit charges the power storage device with a supplied voltage;

a control circuit configured to control the charge circuit so that the charging is performed in a period during which the sample is not measured; and a deflection control circuit configured to deflect the charged particle so as to two-dimensionally scan the sample based on a synchronization signal, wherein the DC voltage stored in the power storage device is supplied as an operating voltage, and wherein the synchronization signal is supplied to the control circuit, and the control circuit controls the charge circuit so as to charge the battery during a long return period in the two-dimensional scanning.

* * * * *